United States Patent
Tang et al.

(10) Patent No.: US 8,400,804 B2
(45) Date of Patent: Mar. 19, 2013

(54) MEMORY DEVICES HAVING BREAK CELLS

(75) Inventors: Yukit Tang, Sunnyvale, CA (US);
Kuoyuan Hsu, San Jose, CA (US);
Derek Tao, Fremont, CA (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 212 days.

(21) Appl. No.: 12/870,925

(22) Filed: Aug. 30, 2010

(65) Prior Publication Data
US 2012/0051112 A1    Mar. 1, 2012

(51) Int. Cl.
*G11C 5/02*    (2006.01)
(52) U.S. Cl. ............... 365/51; 365/226; 365/230.06
(58) Field of Classification Search ............... 365/51, 365/226, 230.06, 230.03, 200, 185.14, 185.18, 365/185.22, 189.06
See application file for complete search history.

(56) References Cited

U.S. PATENT DOCUMENTS

| | | | |
|---|---|---|---|
| 6,459,642 B1* | 10/2002 | Cho et al. | 365/225.7 |
| 2005/0199825 A1* | 9/2005 | Moffatt | 250/440.11 |
| 2009/0116286 A1* | 5/2009 | Chong et al. | 365/185.13 |

* cited by examiner

*Primary Examiner* — Dang Nguyen
(74) *Attorney, Agent, or Firm* — Duane Morris LLP

(57) ABSTRACT

A representative memory device includes a cell array, at least one break cell that subdivides the cell array into bit cell arrays, and one or more power switches that are electrically coupled to the bit cell. In one embodiment, the break cell separates a connectivity of a first voltage and a second voltage between at least two bit cell arrays so that the bit cell arrays can be selectively coupled to either the first voltage or the second voltage using the power switches. The power switches control the connection of each separated bit cell array of the cell array to either the first voltage or second voltage.

20 Claims, 6 Drawing Sheets

MEMORY DEVICES HAVING BREAK CELLS

TECHNICAL FIELD

The present invention relates generally to electrical circuits, especially memory devices with arrays of sequential conductively-coupled adjacent bit cells, and more particularly memory devices having break cells that are inserted into rows or columns of otherwise conductively coupled sequences of such cells, wherein switches controllably couple operational voltages to discrete subsets of an array of memory cells when needed, the switches being arranged between supply voltages or selected supply voltages, and the cells that are near-by or adjacent the break cells.

BACKGROUND

Typically, memory devices, such as static random access memory (SRAM) devices, consume power during activation, such as when switching from a data retention mode into an operational mode for writing to the memory devices or when coupling power to the memory devices to enter a write-assist mode. This is because the virtual power (e.g., VDDI) and ground (e.g., VSSI) voltages are brought up to an operational level, i.e., a larger potential difference is coupled across the bit cell array of the memory device to make the bit cells operational. Power is consumed when the cells are charged or discharged to a higher potential defined between voltages VDD/VSS, respectively. The active power consumption depends on the capacitance of the entire circuit coupled between the VDDI/VSSI nodes, which is charged when the power supply voltages are applied.

When the memory device is switched from the retention mode to the operational mode, the entire bit cell array of the memory devices may be switched into the active mode and consume power in becoming operational, even if, for example, only one row of bit cells actually is being accessed for updating their content or the like. This results in large power consumption when switching and also static power consumption while remaining in the operational mode. Currently, the issue can be addressed with a Local IO (LIO) circuit that selects an active memory area to be powered. But a full function LIO occupies huge circuit area, which is not desirable.

An improved technique for selectively charging and powering bit cells in a memory device design would be advantageous.

BRIEF DESCRIPTION OF THE DRAWINGS

The accompanying drawings illustrate preferred embodiments of the invention, as well as other information pertinent to the disclosure, in which.

DETAILED DESCRIPTION

Exemplary systems are discussed with reference to the figures. Although these systems are described in detail, they are provided for purposes of illustration only and various modifications are feasible within the scope of the subject matter claimed.

In general, the disclosed memory devices are configured to reduce static and active power consumption as well as to reduce noise when the memory devices switch from a data retention mode to an operational mode or from/to a write-assist mode. These switching conditions are when a potential difference or an increased potential difference is applied to the bit cells of the device, and due to inherent capacitance requires the bit cells to charge up to the applied potential difference, thereby consuming power.

Figure 1:
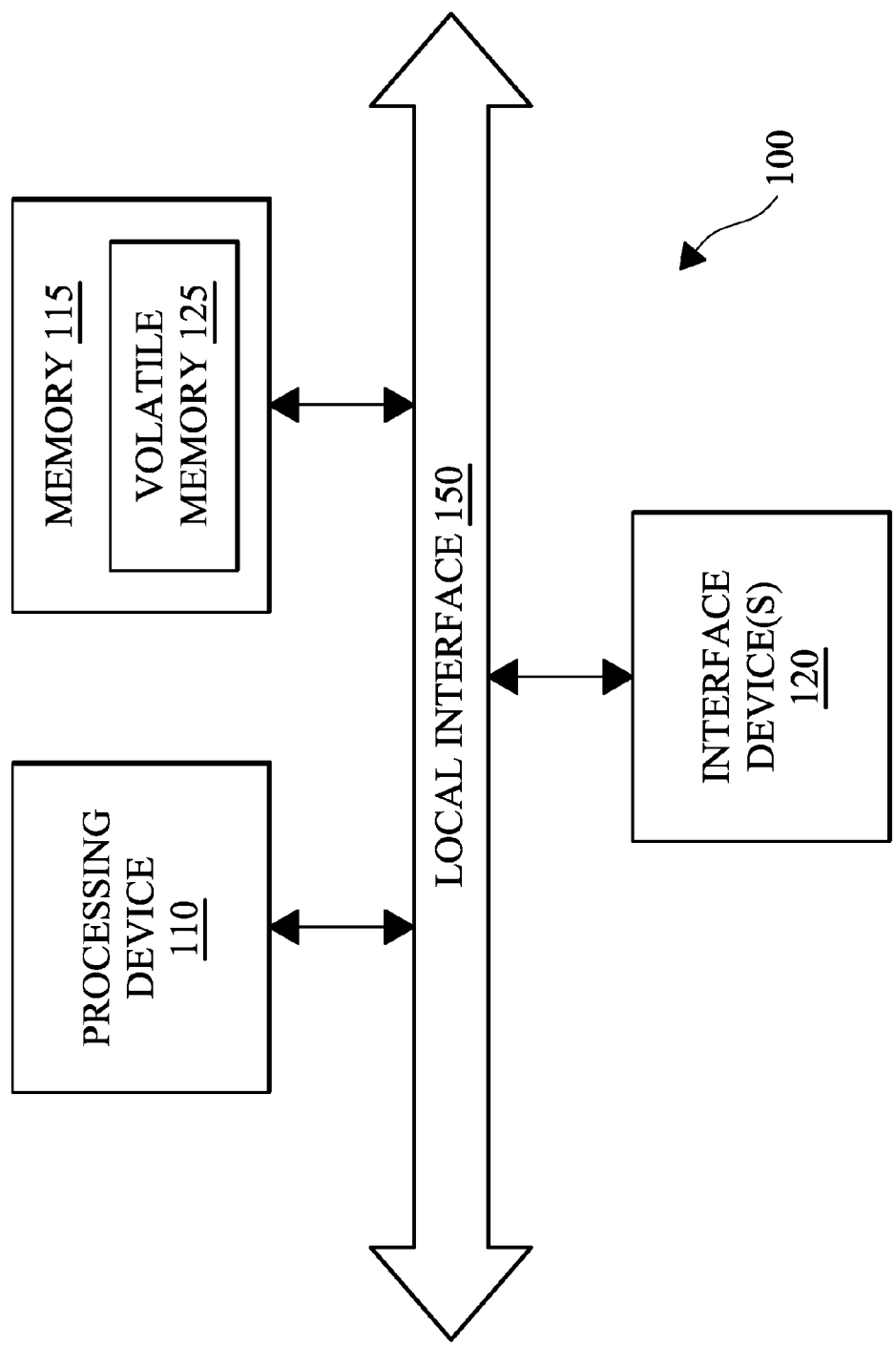
FIG. 1 is a block diagram that illustrates a system having a memory in accordance with an embodiment of the present disclosure.

FIG. 1 is a block diagram that illustrates a system 100 having a memory 125 in accordance with an embodiment of the present disclosure. The system 100 can be an exemplary architecture for a generic computer. The system 100 comprises a processing device 110, memory 115, and one or more user interface devices 120, each of which is connected to a local interface 150 (e.g., a bus). The processing device 110 can include any custom made or commercially available processor, a central processing unit (CPU) or an auxiliary processor among several processors associated with the generic computer, a semiconductor based microprocessor (in the form of a microchip), or a macroprocessor.

The one or more user interface devices 120 comprise those components with which the user (e.g., administrator) can interact with the system 100. Where the system 100 comprises a server computer or similar device, these components can comprise those typically used in conjunction with a PC such as a keyboard and mouse.

The memory 115 normally comprises various programs (in software and/or firmware) including an operating system (O/S) (not shown). The O/S controls the execution of programs, and provides scheduling, input-output control, file and data management, memory management, and communication control and related services. The memory 115 can include any one or a combination of memory 125 (e.g., random access memory (RAM, such as DRAM, SRAM, etc.)) and nonvolatile memory (e.g., ROM, hard drive, tape, CDROM, etc.) (not shown). The architecture of the memory 115 is further described in connection with FIGS. 2-6.

Figure 2:
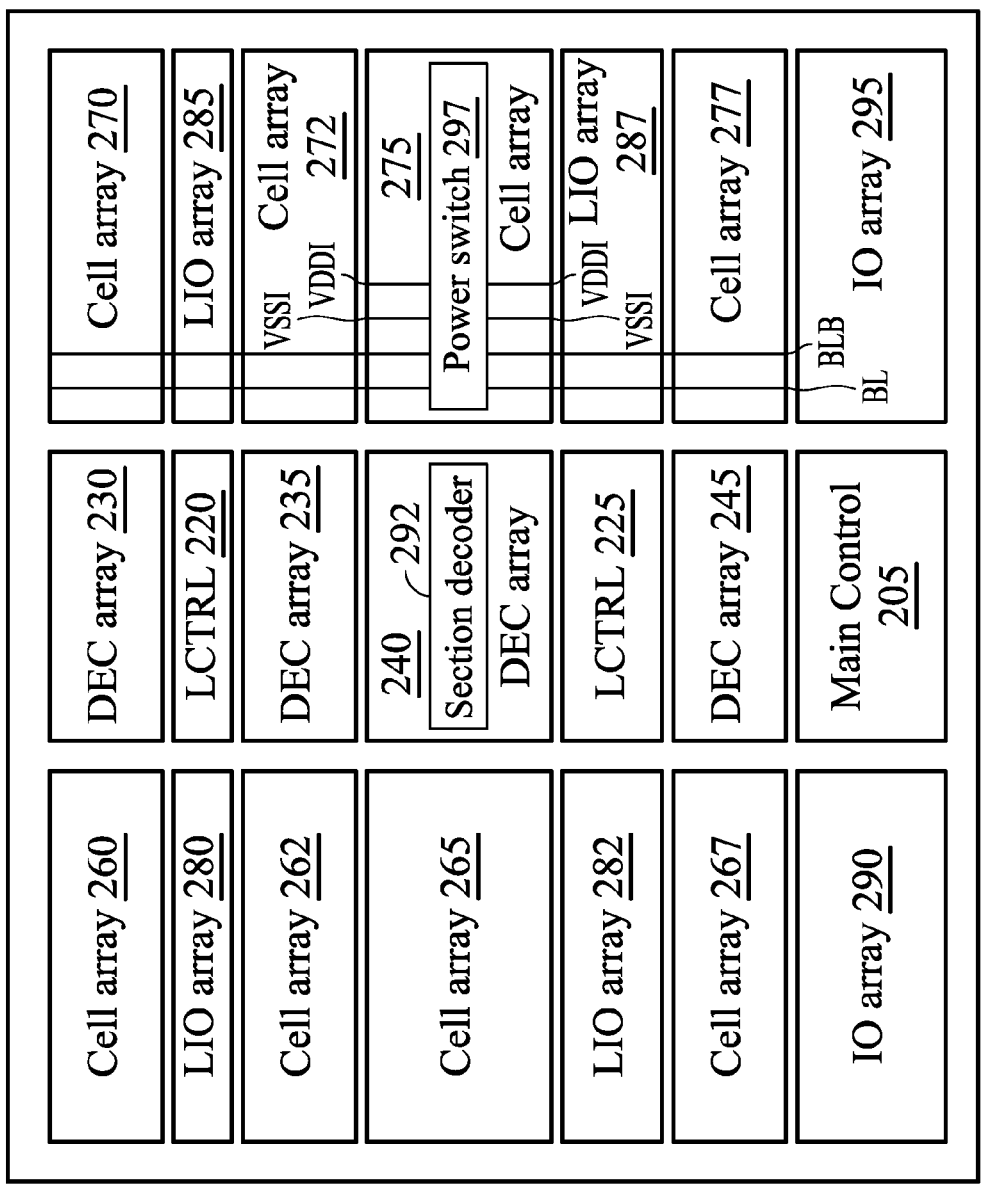
FIG. 2 is a block diagram of a memory in accordance with an embodiment of the present disclosure.

FIG. 2 is a block diagram of a memory 115, such as that shown in FIG. 1. In this example, the memory 115 can be the volatile memory 125, e.g., static random access memory (SRAM). The volatile memory 125 includes a main control 205 that sends signals to decoder arrays 230, 235, 240, 245 and the local control circuits 220, 225. In general, the function of the main control 205 is to control operations of the volatile memory 125 by effecting switching and addressing functions. These included, for example read and write functions, address pre-decode for selecting, for example, a word line driver, chip enable/disable functions, self timing generation, and communication through input/output (I/O) arrays 290, 295, among others. The function of the local control circuits 220, 225 is to control local input/output (I/O) array 280, 282, 285, 287 for local bit line pre-charge, write pass gate, and sense amplifier enable, among others.

The local control circuits 220, 225 receives instructions from the main control 205 to turn on or off a memory cell array 260, 262, 265, 267, 270, 272, 275, 277. The local control circuits 220, 225 use the local input/output arrays 280, 285 to communicate with memory cell arrays 260, 265, 270, 275. Input/output arrays 290, 295 are used to receive or send digital information stored in memory cell arrays 260, 262, 265, 267, 270, 272, 275, 277 to and from other electrical components such as the processing device 110 and/or user interface device 120 (FIG. 1). The local input/output arrays 280, 282, 285, 287 and input/output arrays 290, 295 are briefly mentioned to provide a system overview.

The volatile memory 125 can further include decoder arrays 230, 235, 240, 245 that facilitate operating bit cells 405 (FIG. 4) of the volatile memory 125 during the read and write operations. In this example, the decoder arrays 240 include one or more section decoders 292 and the cell array 275 includes one or more power switches 297. Other decoder arrays 230, 235, 245 and cell arrays 260, 262, 265, 267, 270, 272, 277 can also include section decoders 292 and power switches 297, respectively. The section decoder 292 can be coupled and can instruct the power switches 297 to connect either a first voltage or second voltage to the cell arrays 260, 262, 265, 267, 270, 272, 277. The section decoders 292 and power switches 297 are further described in connection with FIGS. 3-6.

Figure 3:
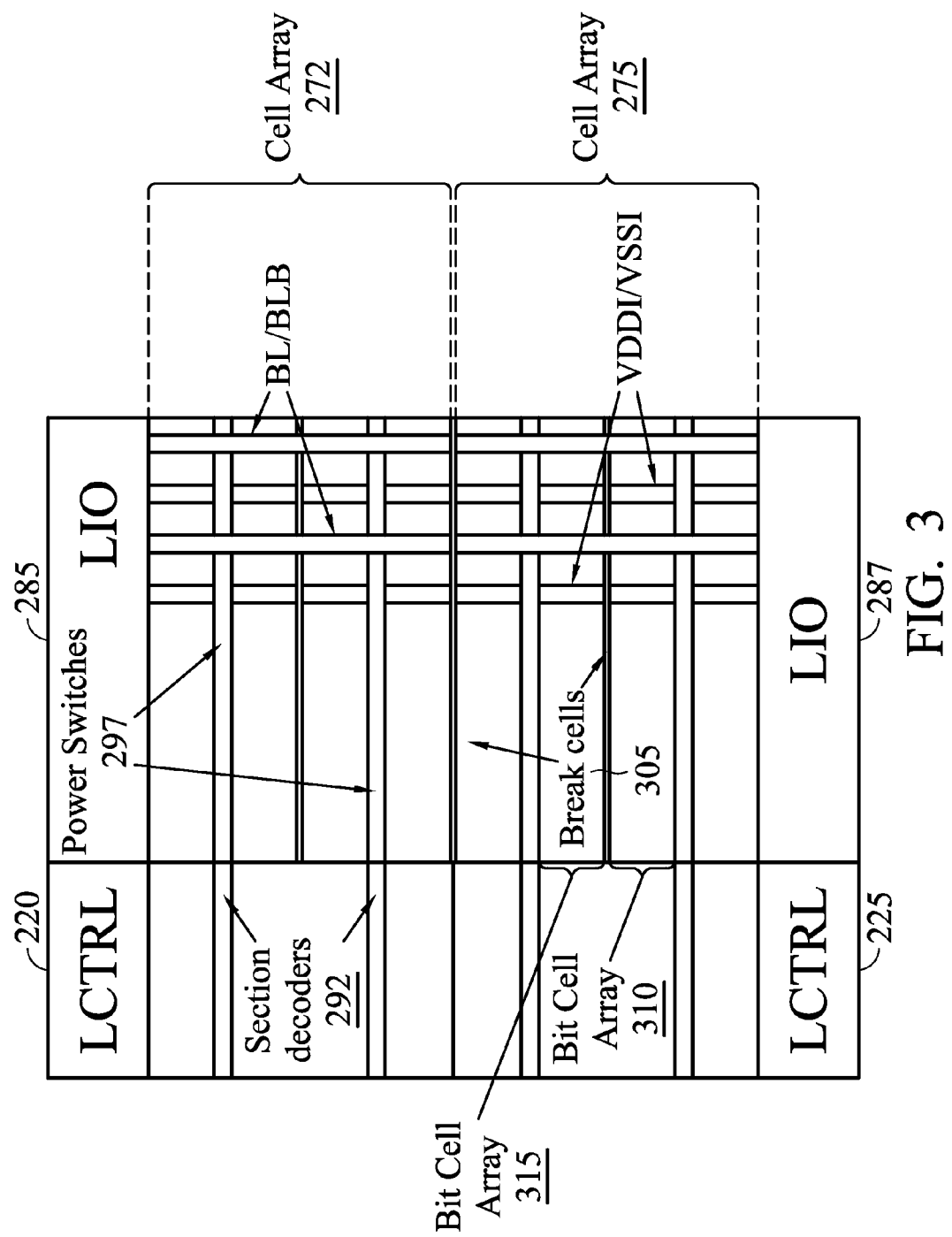
FIG. 3 is a layout diagram that illustrates a portion of a memory in accordance with an embodiment of the present disclosure.

FIG. 3 is a schematic diagram that illustrates a portion of a memory 115, such as that shown in FIG. 2, having local control circuits 220, 225, local input/output arrays 285, 287, and cell arrays 272, 275. In this example, the local input/output arrays 285, 287 are electrically coupled to the local control circuits 220, 225, respectively. A plurality of bit lines BL/BLB are electrically coupled to the local input/output arrays 285, 287. The local control circuits 220, 225 and the local input/output arrays 285, 287 can be implemented by using any control circuits and any input/output arrays and are not restricted to the local control circuits 220, 225, as depicted in FIG. 3.

The cell arrays 272, 275 are electrically coupled to the plurality of bit lines BL/BLB. Each cell array 272, 275 can be subdivided into one or more bit cell arrays 310, 315 by break cells 305. According to one aspect, at least one break cell 305 separates a connectivity of a first voltage (e.g., VDDI) and a second voltage (e.g., VSSI) between at least two bit cell arrays 310, 315. In other words, the break cells 305 delineate separate subsets (e.g., rows of bit cells 310, 315) of the bit cells 405 so that the subsets of the bit cells 405 (FIG. 4) can be powered independently of other subsets.

A plurality of bit lines BL/BLB are coupled to the cell arrays 272, 275. The power switches 297 are electrically coupled to the bit cell 405. Each separated bit cell array 310, 315 of the cell array 272, 275 is controlled by the power switches 297 for connecting to either the first voltage (e.g., VDDI) or second voltage (e.g., VSSI) to the separated row of bit cells 310, 315. The section decoders 292 are coupled and can instruct the power switches 297 to connect either the first voltage (e.g., VDDI) or second voltage (e.g., VSSI) to each separated bit cell array 310, 315. The power/ground lines connected to power switches 297 are cut in the break cells 305, separating the power/ground lines from the near-by or adjacent bit cell array 310, 315 at two sides of the break cell 305. In other words, the break cells 305 cut the power/ground lines between bit cell arrays 310, 315, resulting in smaller bit cell arrays 310, 315 which can speed up the charge and discharge times and reduce power consumption.

Figure 4:
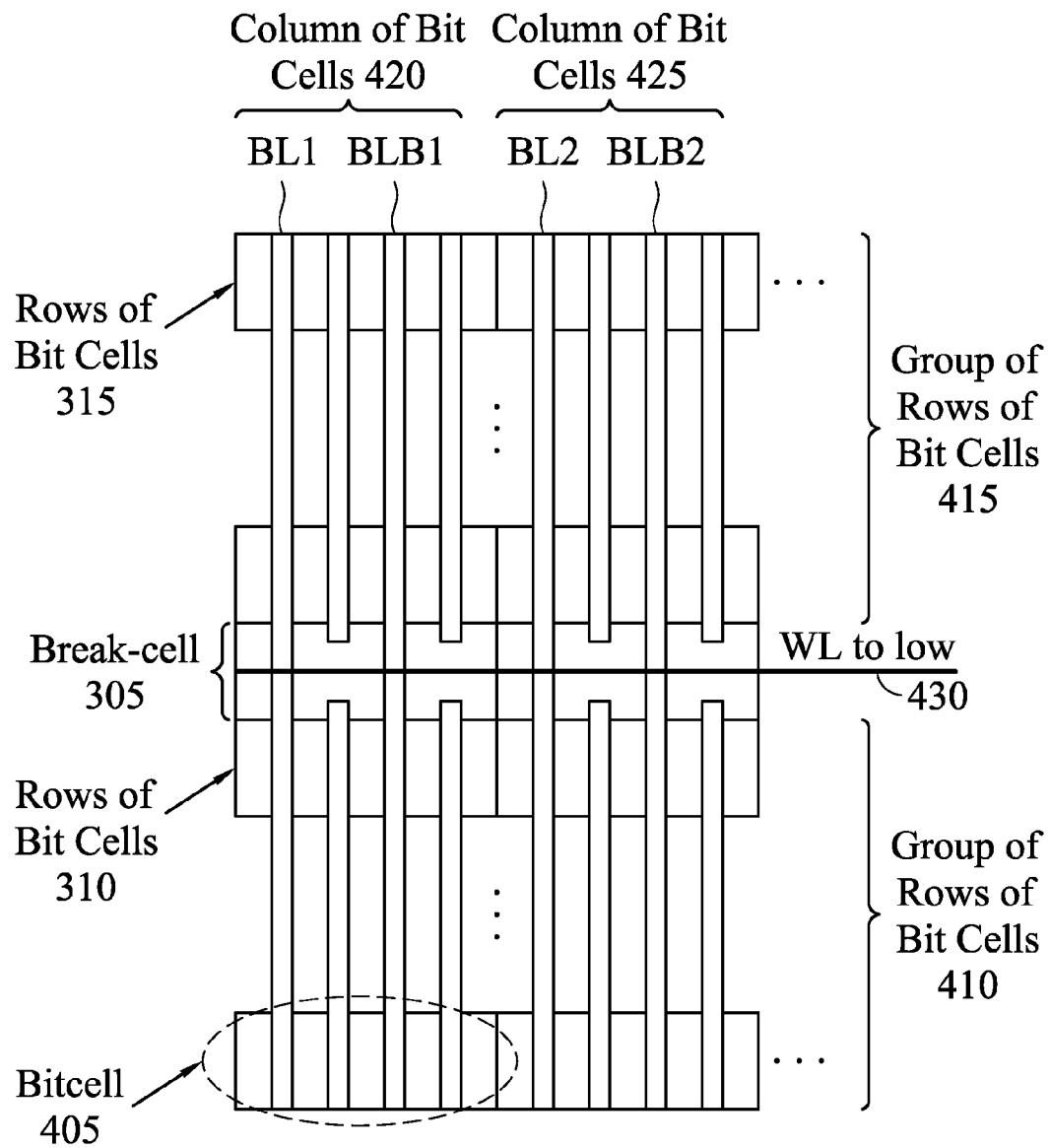
FIG. 4 is a layout diagram that illustrates an additional aspect of a memory in accordance with an embodiment of the present disclosure.

FIG. 4 is a layout diagram that illustrates an additional aspect of a memory 115 (FIG. 2) between power switches 297 (FIG. 3). The bit cell arrays can be arranged in rows of bit cells 310, 315 or columns of bit cells 420, 425, both of which include at least one bit cell 405. The rows of bit cells 310, 315 can be grouped together forming groups of rows of bits cells 410, 415. Similarly, the columns of bit cells 420, 425 can be grouped together forming groups of columns of bits cells 420, 425.

The break cell 305 can be made of modified materials from the bit cells 405 because the bit cell array 310, 315 is sensitive to surrounding layout patterns (e.g. poly, diffusion, and etc). One solution to this sensitivity is designing the break cells 305 to have substantially similar patterns of near-by (or adjacent) bit cells 405. The break cells 305, however, further include word lines 430 that are connected to a low voltage to turn off a pass transistor in the bit cell 405, and the VDDI/VSSI metal lines are removed from the break cells 305.

Alternatively or additionally, the bit cells 405 can be arranged into one or more columns of bit cells 420, 425. Although not shown, a break cell 305 can separate a connectivity of a first voltage or second voltage between at least two columns of bit cells 420, 425 of the cell array, similar to that shown in FIG. 4. Each separated column of bit cells 420, 425 of the cell array is controlled by the one or more power switches 297 for connecting to either the first voltage or second voltage to the separated column of bit cells 420, 425. The section decoders 292 can be coupled and instructs the power switches 297 to connect either the first voltage or second voltage to each separated column of bit cells 420, 425.

Figure 5:
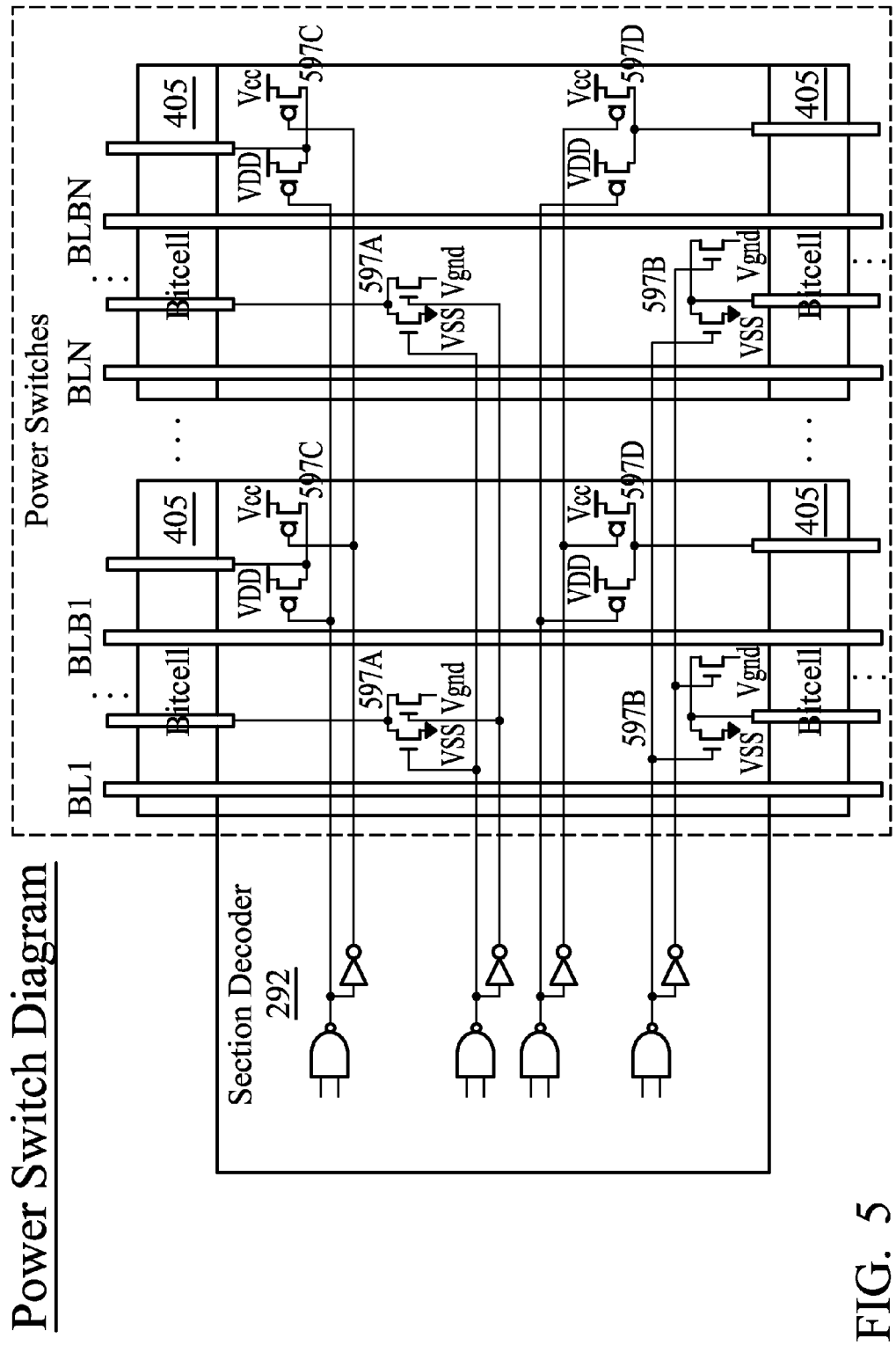
FIG. 5 is a circuit-layout diagram that illustrates a portion of a memory in accordance with another embodiment.

FIG. 5 is a circuit-layout diagram that illustrates a portion of a memory 115 in accordance with yet another embodiment of the present disclosure. In this example, the section decoder 292 can be implemented with NAND gates and inverters. The power switches 597A-C in this configuration can connect the bit cells 405 selectively to four different voltages, such as VSS, Vgnd, VDD, and Vcc. The power switches 597A-B can connect the bit cells 405 to either the VSS or Vgnd, and the power switches 597C-D can connect the bit cells 405 to either the VDD or Vcc. An exemplary operation of the memory 115 is described as follows. In the data retention mode, the bit cells 405 are coupled to Vgnd at VSSI and VDD at VDDI. In an operational mode such as a write operation or a write-assist operation requiring additional operational voltage, the bit cells 405 are coupled to VSS at VSSI and VDD or VCC at VDDI.

Figure 6:
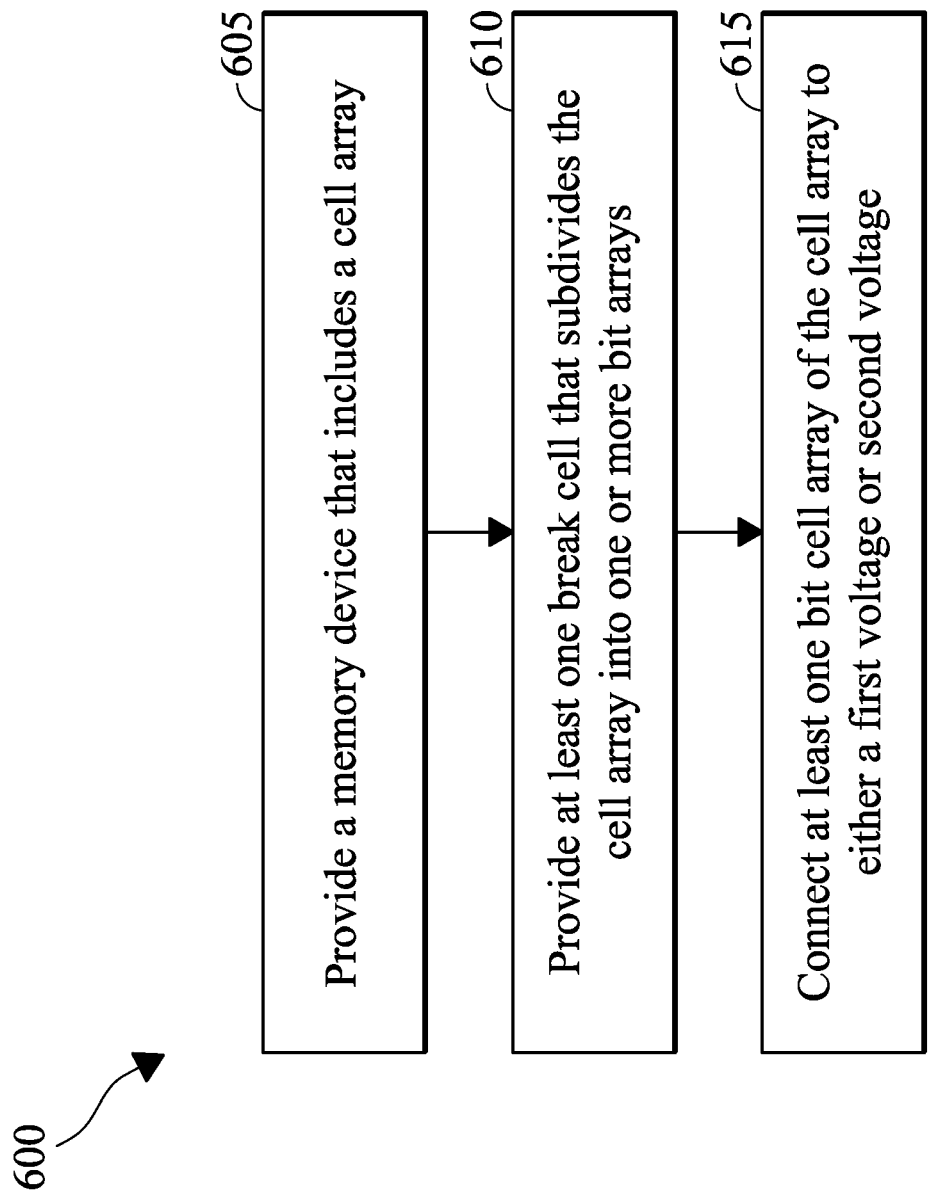
FIG. 6 is a flow diagram that illustrates an embodiment of the architecture, functionality, and/or operation of a memory device in accordance with an embodiment of the present disclosure.

FIG. 6 is a flow diagram 600 that illustrates an embodiment of the architecture, functionality, and/or operation of the memory device 115, such as that shown in FIG. 1. The flow diagram 600 begins with block 605, which provides the memory device 115 to include a cell array 272, 275. In block 610, the memory device 115 is provided with at least one break cell 305 that subdivides the cell array 272, 275 into one or more bit cell arrays 310, 315. The break cell 305 separates a connectivity of a first voltage and a second voltage between at least two bit cell arrays 310, 315. In block 615, one or more power switches 297 of the memory device 115 connect at least one separated bit cell array 310, 315 of the cell array 272, 275 to either the first voltage or second voltage.

To control the power switches 297, a control circuit 220, 225 can send instruction signals to a section decoder 292 that instructs the power switches 297 to connect either the first voltage or second voltage to the at least one separated bit cell array 310, 315 based on the instruction signals. The section decoder 292 can instruct the power switches 297 by sending control signals to the power switches 297 that control the connection of each separated bit cell array 310, 315 of the cell array 272, 275 to either the first voltage or second voltage based on the control signals.

Alternatively or additionally, the step in block 605 can include providing the bit cell arrays 310, 315 that include one or more rows or columns of bit cells. The step in block 610 can include the step of separating the connectivity of the first voltage or second voltage between at least two rows or columns of bit cells of the cell array. Accordingly, the control circuit 220, 225 can send instruction signals to the section decoder 292 that instructs the power switches 297 to connect either the first voltage or second voltage to the at least one separated row or column of bit cells based on the instruction signals. The section decoder 292 can instruct the power switches 297 by sending the control signals to power switches 297 that control a connection of at least one separated row or column of bit cells of the cell array to either the first voltage or second voltage based on the control signals.

Some of the advantages of the architecture, operation, and functionality of the memory 115 previously described are that the section decoders 292 can select which rows (or columns) of bit cells to switch from a retention mode to an operational mode or switching from/to a write-assist mode. The power switches 297 can be used to charge and discharge VDDI/VSSI at different selected subsets of the bit cells 405, either individually or in combinations of subsets such as selected rows and/or columns. Inasmuch as the VDDI/VSSI are applied to subsets such as rows of bit cells 310, 315, there is less capacitance involved in the subset of bit cells 405 that are switched into operational mode and the overall active power consumption is reduced during wake up compared to an arrangement wherein all or a larger portion of the memory cells were made operational at that same time. Non-accessed bits remain in retention mode to reduce static power consumption.

A representative memory device includes a cell array, at least one break cell that subdivides the cell array into bit cell arrays, and one or more power switches that are electrically coupled to the bit cell. In one embodiment, the break cell separates a connectivity of a first voltage and a second voltage between at least two bit cell arrays so that the bit cell arrays can be selectively coupled to either the first voltage or the second voltage using the power switches. The power switches control the connection of each separated bit cell array of the cell array to either the first voltage or second voltage. The cells that are required to be operational at a given time are selectively coupled between the different potentials that render the cells operational, by closing corresponding conductive circuits.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A random access memory comprising:
   a cell array having bit cells;
   at least one break cell that subdivides the cell array into two or more bit cell array subsets, wherein the at least one break cell separates a connectivity of a first voltage and a second voltage between at least two bit cell array subsets; and
   one or more power switches that are electrically coupled to the bit cells of the two or more bit cell array subsets for selectively controlling a connection of each separated bit cell array subset of the cell array to either the first voltage or second voltage such that each bit cell array subset is powered independently of the other bit cell array subsets.

2. The random access memory of claim 1, further comprising a section decoder that is coupled to the one or more power switches, wherein the section decoder instructs the one or more power switches to connect either the first voltage or second voltage to each separated bit cell array.

3. The random access memory of claim 1, wherein the bit cell arrays include one or more rows or columns of bit cells and the at least one break cell separates the connectivity of the first voltage or second voltage between at least two rows or columns of bit cells of the cell array, wherein each separated row or column of bit cells of the cell array is controlled by the one or more power switches for connecting to either the first voltage or second voltage to the separated rows or columns of bit cells.

4. The random access memory of claim 3, further comprising a section decoder that is coupled to the one or more power switches, wherein the section decoder instructs the one or more power switches to connect either the first voltage or second voltage to each separated row or column of bit cells.

5. The random access memory of claim 1, wherein the at least one break cell is made of modified materials from the bit cells.

6. The random access memory of claim 1, further comprising a plurality of bit lines that are coupled to the cell array.

7. The random access memory of claim 6, further comprising at least one local input/output array that is coupled to the plurality of bit lines.

8. The random access memory of claim 7, further comprising at least one local control circuit that is electrically coupled to the at least one local input/output array.

9. The random access memory of claim 1, wherein the one or more power switches control a connection of each separated bit cell array of the cell array to the first voltage, the second voltage, a third voltage, or a fourth voltage.

10. The random access memory of claim 1, wherein the one or more power switches connect each separated bit cell array of the cell array to the first voltage during a first operational mode and connect each separated bit cell array of the cell array to the second voltage during a second operational mode.

11. The random access memory of claim 10, wherein the first operational mode is a data retention mode, and the second operational mode is a write mode.

12. A memory device comprising:
    at least one control circuit;
    at least one input/output array that is electrically coupled to the at least one control circuit;
    a plurality of bit lines that are electrically coupled to the at least one input/output array;
    a cell array that is electrically coupled to the plurality of bit lines, the cell array having bit cells;
    at least one break cell that subdivides the cell array into two or more bit cell array subsets, wherein the at least one break cell separates a connectivity of a first voltage and a second voltage between at least two bit cell array subsets; and
    one or more power switches that are electrically coupled to the bit cells, wherein the one or more power switches selectively control a connection of each separated bit cell array of the cell array to either the first voltage or second voltage such that each bit cell array subset is powered independently of the other bit cell array subsets, wherein the at least one control circuit controls the at least one input/output array for at least one of the following functionalities: read and write.

13. The memory device of claim 12, further comprising a section decoder that is coupled to the one or more power switches, wherein the section decoder instructs the one or more power switches to connect either the first voltage or second voltage to each separated bit cell array.

14. The memory device of claim 12, wherein the bit cell arrays include one or more rows or columns of bit cells and the at least one break cell separates the connectivity of the first voltage or second voltage between at least two rows or columns of bit cells of the cell array, wherein each separated row or column of bit cells of the cell array is controlled by the one or more power switches for connecting to either the first voltage or second voltage to the separated row or column of bit cells.

15. The memory device of claim 14, further comprising a section decoder that is coupled to the one or more power switches, wherein the section decoder instructs the one or more power switches to connect either the first voltage or second voltage to each separated row or column of bit cells.

16. The memory device of claim 12, wherein the at least one break cell is made of bit cells.

17. A method of operating a memory device, comprising:
providing a memory device that includes a cell array;
providing at least one break cell that subdivides the cell array into two or more bit cell arrays, wherein the at least one break cell separates a connectivity of a first voltage and a second voltage between at least two bit cell arrays; and
connecting at least one separated bit cell array of the cell array to either the first voltage or second voltage in response to receiving control signals at one or more power switches that control the connection of each separated bit cell array of the cell array to either the first voltage or second voltage.

18. The method of claim 17, further comprising providing instruction signals to a section decoder that instructs the one or more power switches to connect either the first voltage or second voltage to the at least one separated bit cell array based on the instruction signals.

19. The method of claim 17, wherein the providing the memory device step includes providing the bit cell arrays that include one or more rows or columns of bit cells.

20. The method of claim 19, wherein the providing the at least one break cell step includes the step of separating the connectivity of the first voltage or second voltage between at least two rows or columns of bit cells of the cell array.

* * * * *